United States Patent
Shi et al.

(10) Patent No.: US 7,271,418 B2
(45) Date of Patent: Sep. 18, 2007

(54) SEMICONDUCTOR APPARATUS FOR WHITE LIGHT GENERATION AND AMPLIFICATION

(75) Inventors: Jin-Wei Shi, Taipei (TW); Jinn-Kong Sheu, Tainan county (TW)

(73) Assignee: National Central University, Taoyuan (TW)

( * ) Notice: Subject to any disclaimer, the term of this patent is extended or adjusted under 35 U.S.C. 154(b) by 0 days.

(21) Appl. No.: 10/948,215

(22) Filed: Sep. 24, 2004

(65) Prior Publication Data
US 2006/0065886 A1    Mar. 30, 2006

(51) Int. Cl.
  *H01L 27/15* (2006.01)
  *H01L 31/12* (2006.01)
  *H01L 31/153* (2006.01)
  *H01L 33/00* (2006.01)

(52) U.S. Cl. .......................... 257/85; 257/86; 257/88; 257/94; 257/96

(58) Field of Classification Search .................. 257/14, 257/79–86, 88, 94, 96, 97, 13
See application file for complete search history.

(56) References Cited

U.S. PATENT DOCUMENTS 6,620,643 B1   9/2003 Koike ........................ 438/30

*Primary Examiner*—Thien F Tran
(74) *Attorney, Agent, or Firm*—Troxell Law Office, PLLC

(57) ABSTRACT

The present invention is a semiconductor apparatus for white light generation and amplification, where, under different current bias, white light can be generated steadily and evenly by folding up multi-wavelength quantum wells and by side-injecting a current. And, the white light can be excited out electronically without mingling with a fluorescent powder so that the cost for sealing is reduced. Because the light is directly excited out by electricity to prevent from energy loss during fluorescence transformation, the light generation efficiency of the present invention is far greater than that of the traditional phosphorus mingled with light-emitting diode of white light. Besides, concerning the characteristics of the white light, the spectrum of the white light can be achieved by adjusting the structure and/or the number of the quantum wells while preventing from being limited by the atomic emission lines of the fluorescent powder.

15 Claims, 6 Drawing Sheets

SEMICONDUCTOR APPARATUS FOR WHITE LIGHT GENERATION AND AMPLIFICATION

FIELD OF THE INVENTION

The present invention relates to a semiconductor apparatus; more particularly, relates to, by stacking MQWs (multi-wavelength quantum wells) and injecting a current from the sidewall of MQW, the present invention can be applied to white-light generator and a white-light amplifier in an optical fiber communication.

DESCRIPTION OF THE RELATED ARTS

Please refer to FIG. 3 and FIG. 4, which, according to the first prior art, are a structural view and a view showing the spectrum of the electronically-excited light. The first prior art uses a blue LED (Light Emitting Diode) to excite the red fluorescent powder and the yellow one. But, the first prior art has the following disadvantages:
1. Because the red light and the yellow light generated by a semiconductor of the white-light generator and amplifier according to the first prior art are excited by the blue light except directly electronically excited, the efficiency of the optoelectronic conversion is quite poor.
2. Because the wavelength of the (blue) light for exciting is far from the wavelengths of the (red and yellow) lights to be exited, extra heat loss will happen on operating the element while shortening its operation life.
3. The packaging of the semiconductor of the white-light generator and amplifier according to the first prior art requires doping with fluorescent powder so its cost become higher.

Please refer to FIG. 5 and FIG. 6, which, according to the second prior art, are a structural view and a view showing the spectrum of the electronically-excited light. Therein, to solve the above problem, the second prior art directly grows a quantum well of red light, yellow light and green light in the light emission active area of a LED so that the required wavelengths to be mixed into a white light can be directly excited out without doping with fluorescent powder while avoiding the above disadvantages. Yet, such a LED is not widely accepted by the market for it still has a critical disadvantage. As shown in FIG. 6, the spectrum of the electronically-excited light is still predominated by the center wavelength of the quantum well near p-side so that the light generated is not an white light with uniform distribution in optical spectrum. Because the movement of holes is far slower than that of electrons, the quantum wells which generate light are gathered up near p-side so that the efficiency of light emission for the quantum wells that generate light of the other colors will become very poor.

SUMMARY OF THE INVENTION

Therefore, the main purpose of the present invention is to provide a semiconductor apparatus for white light generation and amplification which can evenly generate white light with high power yet without doping any fluorescent powder. So, the present invention is a semiconductor apparatus for white light generation and amplification. By stacking MQWs (multi-wavelength quantum wells) and injecting a current from the sidewall of the MWQs while the current flows in parallel paths to every well, the carriers are distributed evenly in every well of different color so that a steady and uniform white light can be generated under different current biases and its optical spectrum will not be changed as the current increases. Because no fluorescent material is required to be doped, the packaging cost can be lowered; and, because the light is generated by direct electroluminescence, the efficiency of the optoelectronic conversion can be greatly improved while being prevented from energy loss during fluorescence transformation. Besides, concerning the characteristics of the white light, its spectrum can be obtained through adjusting the structure and the number of MQW while preventing from being limited to the atom emission spectrum of the fluorescent powder. The present invention can be applied to a white-light generator and a white-light amplifier in an optical fiber communication.

BRIEF DESCRIPTIONS OF THE DRAWINGS

The present invention will be better understood from the following detailed description of preferred embodiments of the invention, taken in conjunction with the accompanying drawings, in which FIG. 1 is a structural view according the present invention;

DESCRIPTION OF THE PREFERRED EMBODIMENT(S)

The following descriptions of the preferred embodiments are provided to understand the features and the structures of the present invention.

Figure 1:
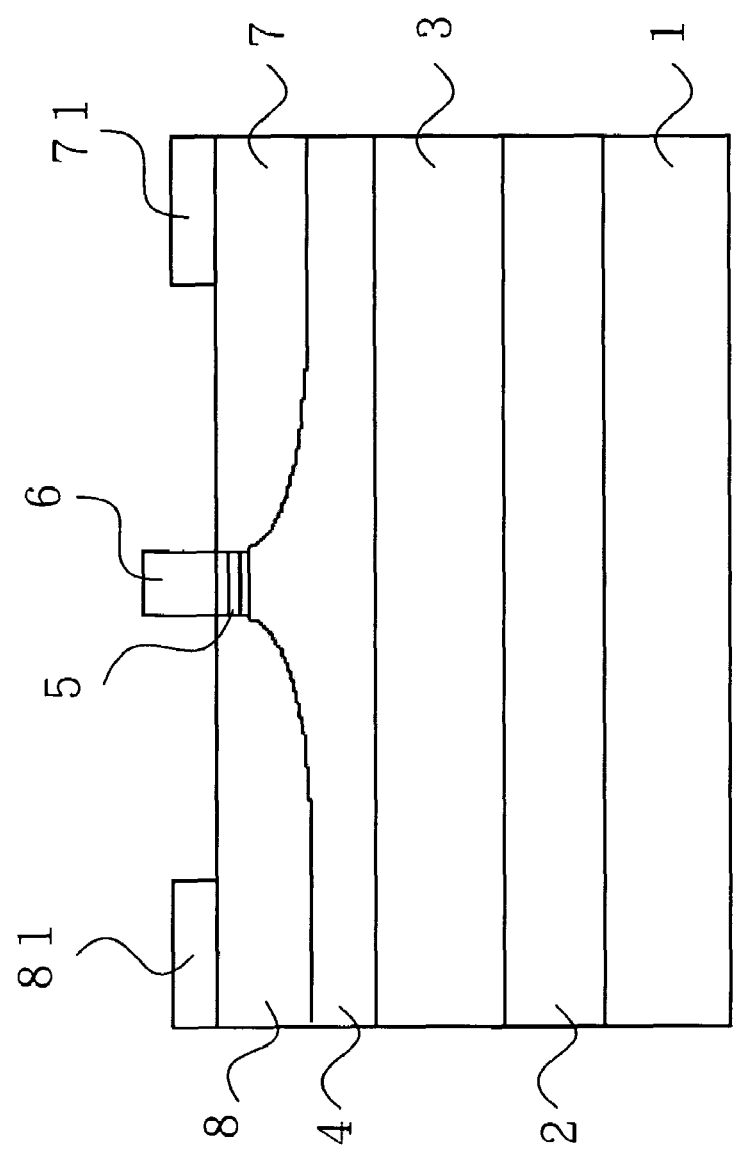
Figure 2:
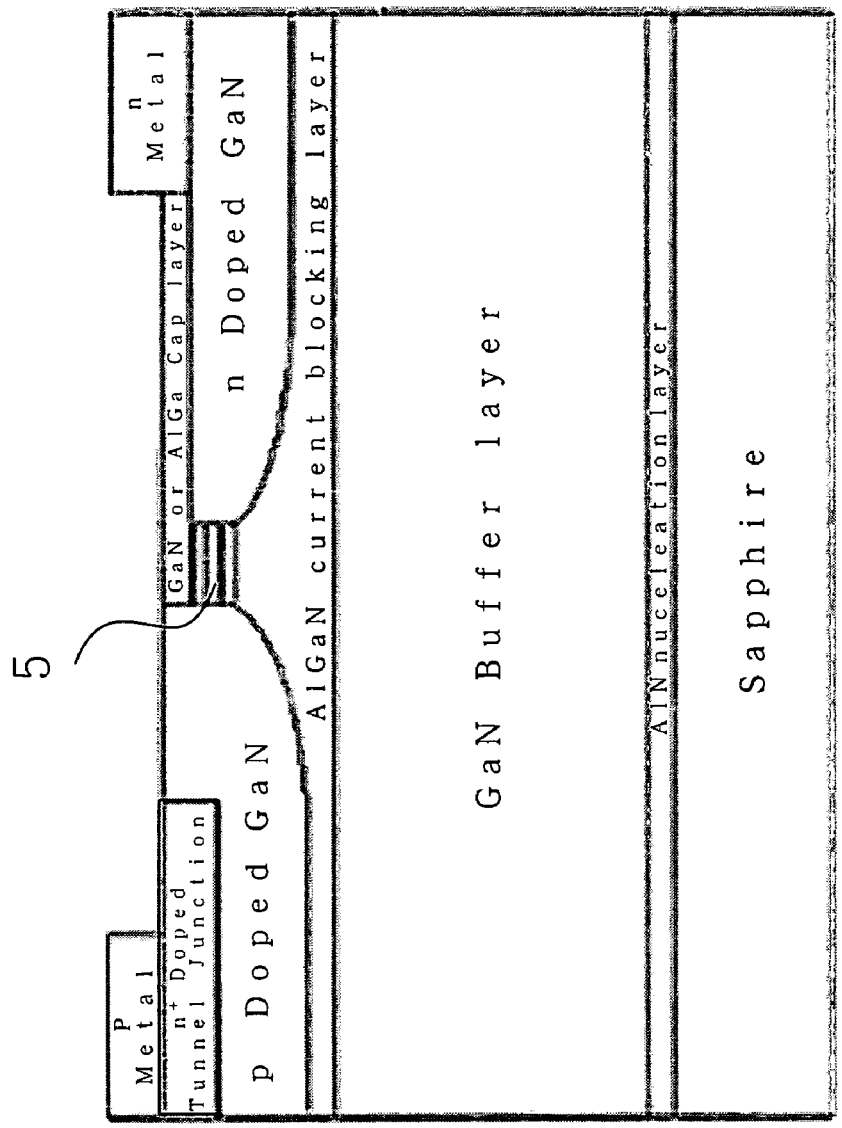
FIG. 2 is a structural view according a preferred embodiment of the present invention.
Figure 3:
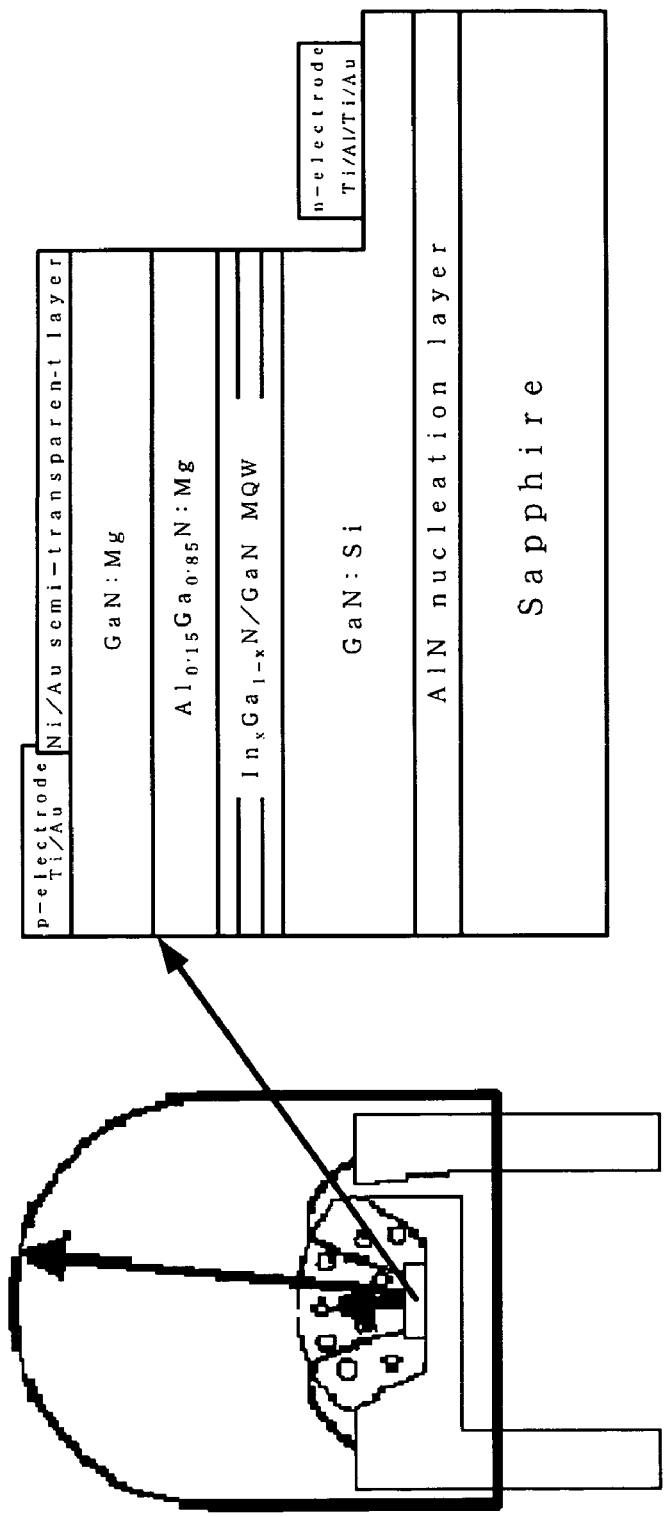
FIG. 3 is a structural view according to the first prior art.
Figure 4:
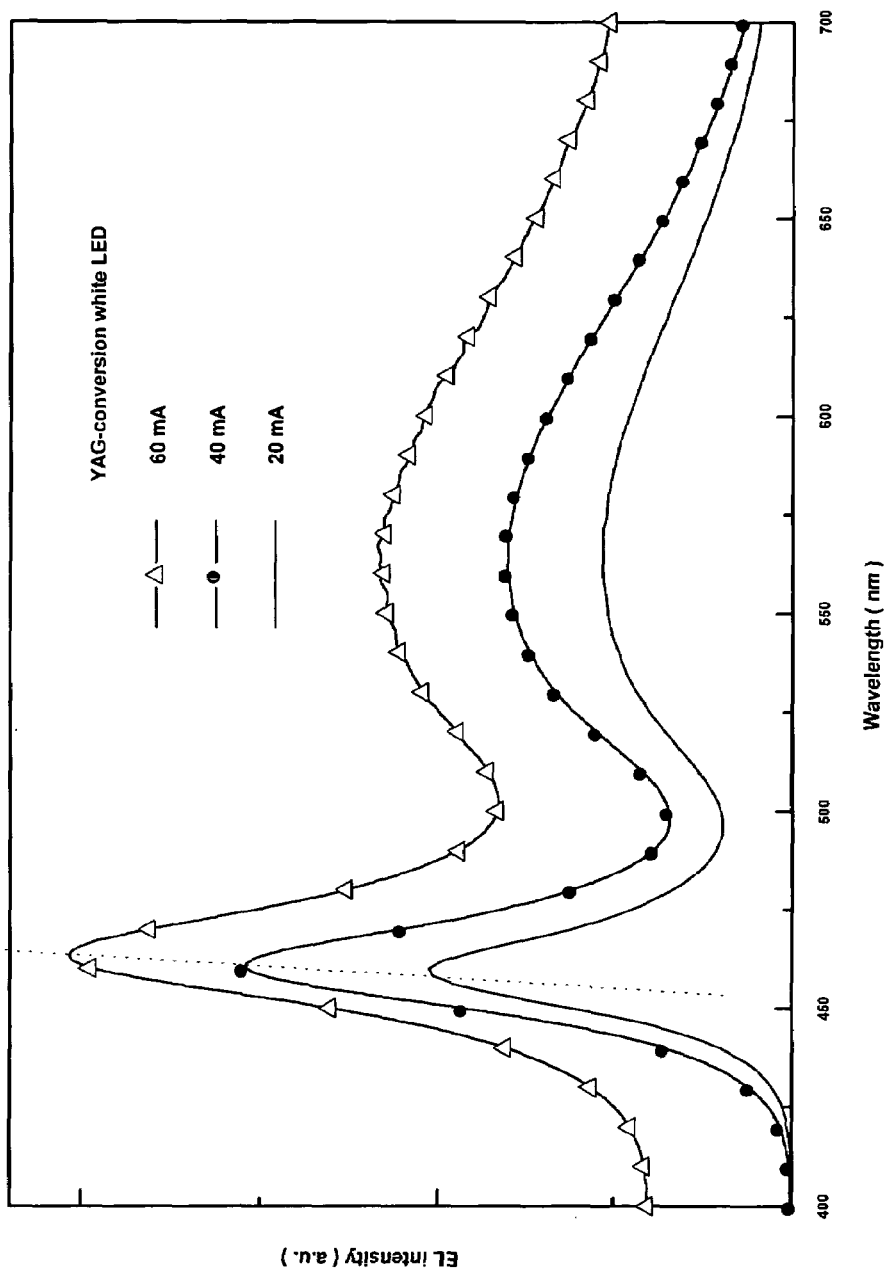
FIG. 4 is a view showing the spectrum of the electronically-excited light according to the first prior art.
Figure 5:
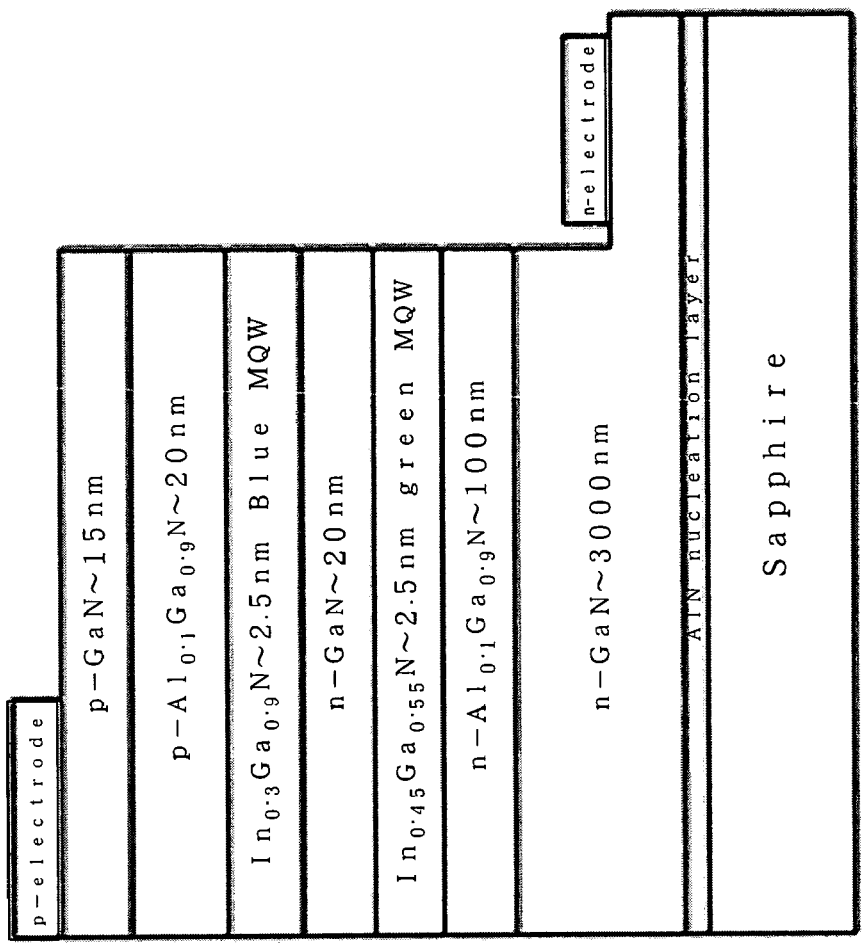
FIG. 5 is a structural view according to the second prior art.
Figure 6:
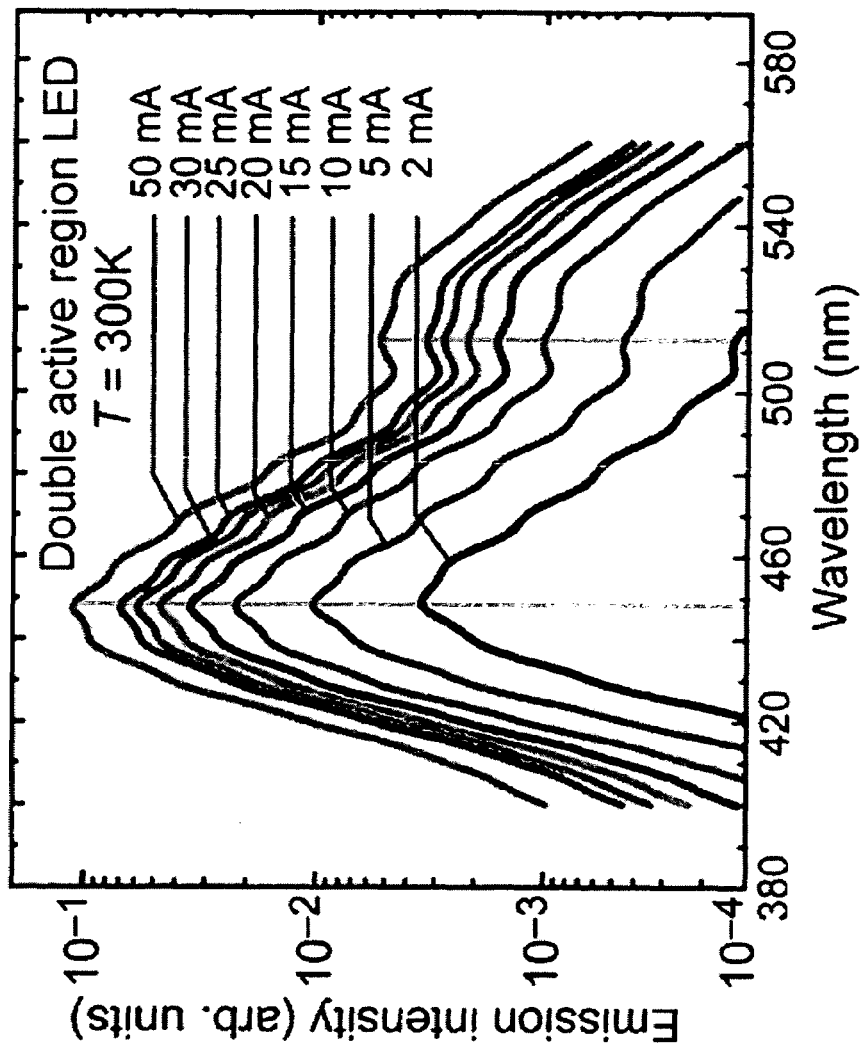
FIG. 6 is a view showing the spectrum of the electronically-excited light according the second prior art.

Please refer to FIG.1 and FIG.2, which are a structural view according the present invention and a structural view according a preferred embodiment of the present invention. As shown in the figures, the present invention comprises a base substrate 1; a first optical cladding 2 formed on the base substrate 1; a second optical cladding 3 formed on the first optical cladding 2; a current blocking and optical cladding layer 4 formed on the second optical cladding 3; a multi-wavelength quantum well (MQW) 5 formed on the current blocking optical cladding layer 4; and a wide-bandgap optical cladding 6 formed on the MQW 5, so that a semiconductor apparatus for white light generation and amplification is constructed. Therein, the base substrate 1 can be made of any kind of compound semiconductor, such as GaAs, InP, AlN or GaN; or an insulator, such as a sapphire, an SiC or a diamond. In order to generate white light, the MQW 5 can comprise layers having different well widths and barrier width. Or, the MQW 5 can comprise layers of different alloys; or layers of semiconductors made of different compounds together with alloys of the compounds to form heterojunctions. An embodiment according to the present invention is shown in FIG.2, where the material of the MQW 5 can be InGaN/GaN or other different compounds, such as InP/InGaAs/InGaAsP, InP/InAlAs/InAlGaAs/InGaAs, GaN/AlGaAN/InGaN or GaAs/AlGaAs. The p doped area 8 and the n doped area 7 located opposite from one another on either side of the MWQ 5 are formed by a re-growth technique on the two opposite sides of the MWQ 5 which is etched to a flat-top. Or, by ion Implantation or thermal diffusion, the p doped material and the n doped material which correspond to the semiconductors are implanted or diffused on two opposite sides of the MQW 5 which together forms a MQW structure such as a p-n diode. Or, furthermore, by a process of heating-up thermal diffusion, the n/p doped areas 7,8 are expanded to a required depth and area; and, at the same time, the radiating area is covered with a proper cover (such as Si3N4). And, by disordering the non-radiating area, the uncovered area and the MQW 5 processed through ion implantation or thermal diffusion, the resistance can be lowered. The top and the bottom of the MQW 5 can be covered each with a layer of a non-doped waveguide whose refractive index is smaller than an equivalent refractive index to-of the MQW 5 to construct an optical waveguide. And by metallization, an N-well lateral metal electrode 71 and an P-well lateral metal electrode 81 are made. Furthermore, by ion implantation on the p-region, an n+ tunnel junction can be formed to simplify the metallization process. At the bottom of the MQW 5, a current blocking optical cladding layer 4 (such as AlGaN) is formed by recrystallization to avoid parasitical conductance.

The present invention is a semiconductor apparatus for white light generation and amplification. Therein, a current is injected from the sidewalls of the MWQ 5 to be evenly distributed at every well and its optical spectrum will not be changed as the current increases; so, a steady and uniform white light can be generated under different current bias. Because the light is generated by direct electroluminescence without doping any fluorescent material, the packaging cost and the extra heat loss can be lowered and the efficiency of the optoelectronic conversion can be greatly improved. And, owing to no metal on the top or under the bottom of the MQW, the efficiency of the light collection can be greatly improved too. Besides, concerning the characteristics of the white light, its spectrum can be obtained through adjusting the structure and the number of MQW while preventing from being limited to the atom emission spectrum of the fluorescent powder. The present invention can be applied to a white-light generator and a white-light amplifier in an optical fiber communication.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A semiconductor apparatus for white light generation and amplification, comprising:
   a base substrate;
   a first optical cladding formed on said base substrate;
   a second optical cladding formed on said first optical cladding;
   a current blocking optical cladding layer formed on said second optical cladding;
   a MQW structure comprising a multi-wavelength quantum well (MQVV) formed on said current blocking optical cladding layer, wherein said MQW is located to be between a p doped area on one side of said MQW and an n doped area on an opposite side of the MQW forming a P-well lateral metal electrode and a N-well lateral metal electrode respectively; and
   a wide-bandgap optical cladding formed on said MQW.

2. The semiconductor apparatus according to claim 1, wherein said MQW structure is constructed to be a diode.

3. The semiconductor apparatus according to claim 1, wherein said MQW is a quantum well having at least one well width and at least one barrier width.

4. The semiconductor apparatus according to claim 1, wherein said MQW is a quantum well comprising at least one alloy.

5. The semiconductor apparatus according to claim 1, wherein said MQW comprises a plurality of layers of materials having at least one heterojunction; and
   wherein said materials are a semiconductor comprising a compound together with an alloy of said compound.

6. The semiconductor apparatus according to claim 5, wherein said plurality of layers is constructed from a material selected from a group consisting of InP/InGaAs/InGaAsP, InP/InAlAs/InAlGaAs/InGaAs, GaN/AlGaAN/InGaN, GaAs/AlGaAs and GaN/InGaN.

7. The semiconductor apparatus according to claim 1, wherein said MQW is constructed as an optical waveguide.

8. The semiconductor apparatus according to claim 7, wherein said optical waveguide is a white light amplifier.

9. The semiconductor apparatus according to claim 1, wherein said base substrate is selected from a group consisting of a semiconductor and an insulator.

10. The semiconductor apparatus according to claim 1, wherein said base substrate is a semiconductor selected from a group consisting of GaAs, InP, AlN and GaN.

11. The semiconductor apparatus according to claim 1, wherein said base substrate is an insulator selected from a group consisting of Sapphire, SiC and diamond.

12. The semiconductor apparatus according to claim 1, wherein said p doped area and said n doped area are both formed by a process selected from a group consisting of recrystallization, thermal diffusion and Ion Implantation.

13. The semiconductor apparatus according to claim 1, wherein said p doped and said n doped areas are formed by Ion Implantation using a process of heating-up thermal diffusion.

14. The semiconductor apparatus according to claim 13, wherein said process of heating-up thermal diffusion further comprises depositing a cover over radiation areas.

15. The semiconductor apparatus according to claim 14, wherein said cover is a $Si_3N_4$ layer.

* * * * *